(12) United States Patent
Shen et al.

(10) Patent No.: US 10,562,148 B2
(45) Date of Patent: Feb. 18, 2020

(54) REAL TIME PROFILE CONTROL FOR CHEMICAL MECHANICAL POLISHING

(71) Applicant: Applied Materials, Inc., Santa Clara, CA (US)

(72) Inventors: Shih-Haur Shen, Sunnyvale, CA (US); Kun Xu, Sunol, CA (US); Tzu-Yu Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 153 days.

(21) Appl. No.: 15/727,288

(22) Filed: Oct. 6, 2017

(65) Prior Publication Data

US 2018/0099374 A1 Apr. 12, 2018

Related U.S. Application Data

(60) Provisional application No. 62/464,217, filed on Feb. 27, 2017, provisional application No. 62/406,264, filed on Oct. 10, 2016.

(51) Int. Cl.
*B24B 37/013* (2012.01)
*B24B 37/04* (2012.01)
(Continued)

(52) U.S. Cl.
CPC .......... *B24B 37/013* (2013.01); *B24B 37/042* (2013.01); *B24B 37/12* (2013.01);
(Continued)

(58) Field of Classification Search
CPC ... B24B 37/013; B24B 37/042; B24B 37/105; B24B 37/12; B24B 37/205; B24B 37/27;
(Continued)

(56) References Cited

U.S. PATENT DOCUMENTS 4,290,240 A * 9/1981 Robinson ................ B24B 21/18
451/297
4,614,100 A * 9/1986 Green .................... B24C 7/0053
29/90.7
(Continued)

FOREIGN PATENT DOCUMENTS

WO WO 2012/030475 3/2012

OTHER PUBLICATIONS

International Search Report and Written Opinion in International Application No. PCT/US2017/055577, dated Jan. 17, 2018, 15 pages.

*Primary Examiner* — George B Nguyen
(74) *Attorney, Agent, or Firm* — Fish & Richardson P.C.

(57) ABSTRACT

A method of controlling processing of a substrate includes generating, based on a signal from an in-situ monitoring system, first and second sequences of characterizing values indicative of a physical property of a reference zone and a control zone, respectively, on a substrate. A reference zone rate and a control zone rate are determined from the first and sequence of characterizing values, respectively. An error value is determined by comparing characterizing values for the reference zone and control zone. An output parameter value for the control zone is generated based on at least the error value and a dynamic nominal control zone value using a proportional-integral-derivative control algorithm, and the dynamic nominal control zone value is generated in a second control loop based on at least the reference zone rate and the control zone rate. The control zone of the substrate is processed according to the output parameter value.

20 Claims, 5 Drawing Sheets

(51) Int. Cl.
  *B24B 37/12* (2012.01)
  *B24B 37/27* (2012.01)
  *B24B 49/05* (2006.01)
  *B24B 51/00* (2006.01)
  *H01L 21/66* (2006.01)

(52) U.S. Cl.
  CPC .............. *B24B 37/27* (2013.01); *B24B 49/05* (2013.01); *B24B 51/00* (2013.01); *H01L 22/26* (2013.01)

(58) Field of Classification Search
  CPC ......... B24B 49/04; B24B 49/05; B24B 49/12; B24B 51/00; H01L 22/26; H01L 22/12
  USPC .............................. 451/5, 6, 7, 41, 285–290
  See application file for complete search history.

(56) References Cited

U.S. PATENT DOCUMENTS

| | | | | |
|---|---|---|---|---|
| 5,951,370 A * | 9/1999 | Cesna | .................... | B24B 37/042 451/21 |
| 6,623,333 B1 * | 9/2003 | Patel | ..................... | B24B 37/005 451/10 |
| 6,707,540 B1 * | 3/2004 | Lehman | .................. | G01N 27/72 324/230 |
| 7,547,242 B2 * | 6/2009 | Hirokawa | .............. | B24B 37/013 451/285 |
| 8,944,884 B2 * | 2/2015 | David | ..................... | B24B 49/12 451/5 |
| 9,579,767 B2 * | 2/2017 | Qian | ...................... | B24B 37/013 |
| 9,673,113 B2 * | 6/2017 | Leighton | ............... | B24B 37/005 |
| 10,065,288 B2 * | 9/2018 | Wu | .......................... | B24B 49/04 |
| 10,090,207 B2 * | 10/2018 | Wu | .......................... | B24B 37/013 |
| 2003/0181139 A1 * | 9/2003 | Lehman | ................ | B24B 37/013 451/8 |
| 2004/0072500 A1 * | 4/2004 | Birang | .................. | B24B 37/005 451/5 |
| 2005/0260922 A1 * | 11/2005 | Gan | ....................... | B24B 37/013 451/5 |
| 2006/0105677 A1 * | 5/2006 | Lin | ........................ | B24B 37/005 451/5 |
| 2010/0217430 A1 | 8/2010 | David et al. | | |
| 2012/0028377 A1 | 2/2012 | David et al. | | |
| 2013/0237128 A1 | 9/2013 | David et al. | | |
| 2014/0273749 A1 | 9/2014 | Qian et al. | | |
| 2015/0147829 A1 | 5/2015 | Benvegnu et al. | | |

\* cited by examiner

REAL TIME PROFILE CONTROL FOR CHEMICAL MECHANICAL POLISHING

CROSS-REFERENCE TO RELATED APPLICATIONS

This application claims priority to U.S. Provisional Application Ser. No. 62/464,217, filed on Feb. 27, 2017, and to U.S. Provisional Application Ser. No. 62/406,264, filed on Oct. 10, 2016, each of which are incorporated by reference.

TECHNICAL FIELD

The present disclosure relates generally to feedback to affect polishing rate corrections during chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as dielectric polishing, the filler layer is a dielectric layer that planarized until a predetermined thickness is left over the underlying layer. Planarization of a dielectric layer can be required for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable profile, e.g., a substrate layer that has been planarized to a desired flatness or thickness, or a desired amount of material has been removed. Variations in the initial thickness of a substrate layer, the slurry distribution, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed. Therefore, it may not be possible to determine the polishing endpoint merely as a function of the polishing time, or to achieve a desired profile merely by applying a constant pressure.

In some systems, a substrate is monitored in-situ during polishing, e.g., by an optical or eddy current monitoring system. Thickness measurements from the in-situ monitoring system can be used to adjust pressure applied to the substrate to adjust the polishing rate and reduce within-wafer non-uniformity (WIWNU).

SUMMARY

In one aspect, a computer program product, tangibly embodied in a computer readable media, has instructions for causing a computer to control processing of a substrate. Based on a signal from an in-situ monitoring system, a first sequence of characterizing values is generated indicative of a physical property of a reference zone on a substrate undergoing processing and being monitored by the in-situ monitoring system, and a second sequence of characterizing values is generated indicative of a physical property of a control zone on the substrate. A reference zone rate is determined from the first sequence of characterizing values, and a control zone rate is determined from the second sequence of characterizing values. An error value is determined by comparing a characterizing value for the reference zone to a characterizing value for the control zone. An output parameter value is calculated for the control zone in a first control loop based on at least the error value and a dynamic nominal control zone value using a proportional-integral-derivative control algorithm. The dynamic nominal control zone value is calculated in a second control loop based on at least the reference zone rate and the control zone rate. The processing system is caused to process the control zone using the output parameter value.

In another aspect, a method of controlling processing of a substrate includes generating based on a signal from an in-situ monitoring system a first sequence of characterizing values indicative of a physical property of a reference zone on a substrate undergoing processing and being monitored by the in-situ monitoring system, generating based on the signal from the in-situ monitoring system a second sequence of characterizing values indicative of a physical property of a control zone on the substrate, determining a reference zone rate from the first sequence of characterizing values, determining a control zone rate from the second sequence of characterizing values, determining an error value by comparing a characterizing value for the reference zone to a characterizing value for the control zone, calculating an output parameter value for control zone in a first control loop based on at least the error value and a dynamic nominal control zone value using a proportional-integral-derivative control algorithm, generating the dynamic nominal control zone value in a second control loop based on at least the reference zone rate and the control zone rate, and processing the substrate, including processing the control zone of the substrate according to the output parameter value.

In another aspect, a polishing system includes a platen to hold a polishing pad, a carrier to hold a substrate in contact with the polishing pad, a motor coupled to at least one of the platen and the carrier to create relative motion therebetween, an in-situ monitoring system configured to generate a signal indicative of a physical parameter of the substrate during polishing of the substrate, and a controller to receive the signal and configured to perform the method.

Certain implementations may have one or more of the following advantages. The control system can be better able adapt to changing environmental parameters (e.g., pad roughness, retaining ring thickness, temperature, aging of consumables, incoming film properties) than a conventional proportional-integral-derivative controller. The profile of the polished substrate can be closer to a target profile, and within-wafer non-uniformity (WIWNU) can be reduced, i.e., thickness uniformity can be improved.

The details of one or more embodiments are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

In conventional proportional-integral-derivative (PID) feedback control system, the nominal processing parameter (e.g., applied pressure) is a user-defined constant. For a substrate processing system in which environmental conditions that effect process can vary (e.g., because the system is dynamic) and/or are initially uncertain, the performance of a PID feedback control system can be adversely affected. For example, in a polishing operation if an environmental condition such as slurry concentration, pad roughness, pad flexibility or retaining ring thickness, is varying over time, a PID feedback control system may not be able to compensate for such variation, resulting in drift of the polishing rate and/or thickness profile.

By configuring the control system to use a secondary control loop to control removal rate, the control system can control the processing parameter to compensate for drift in environmental conditions.

Figure 1:
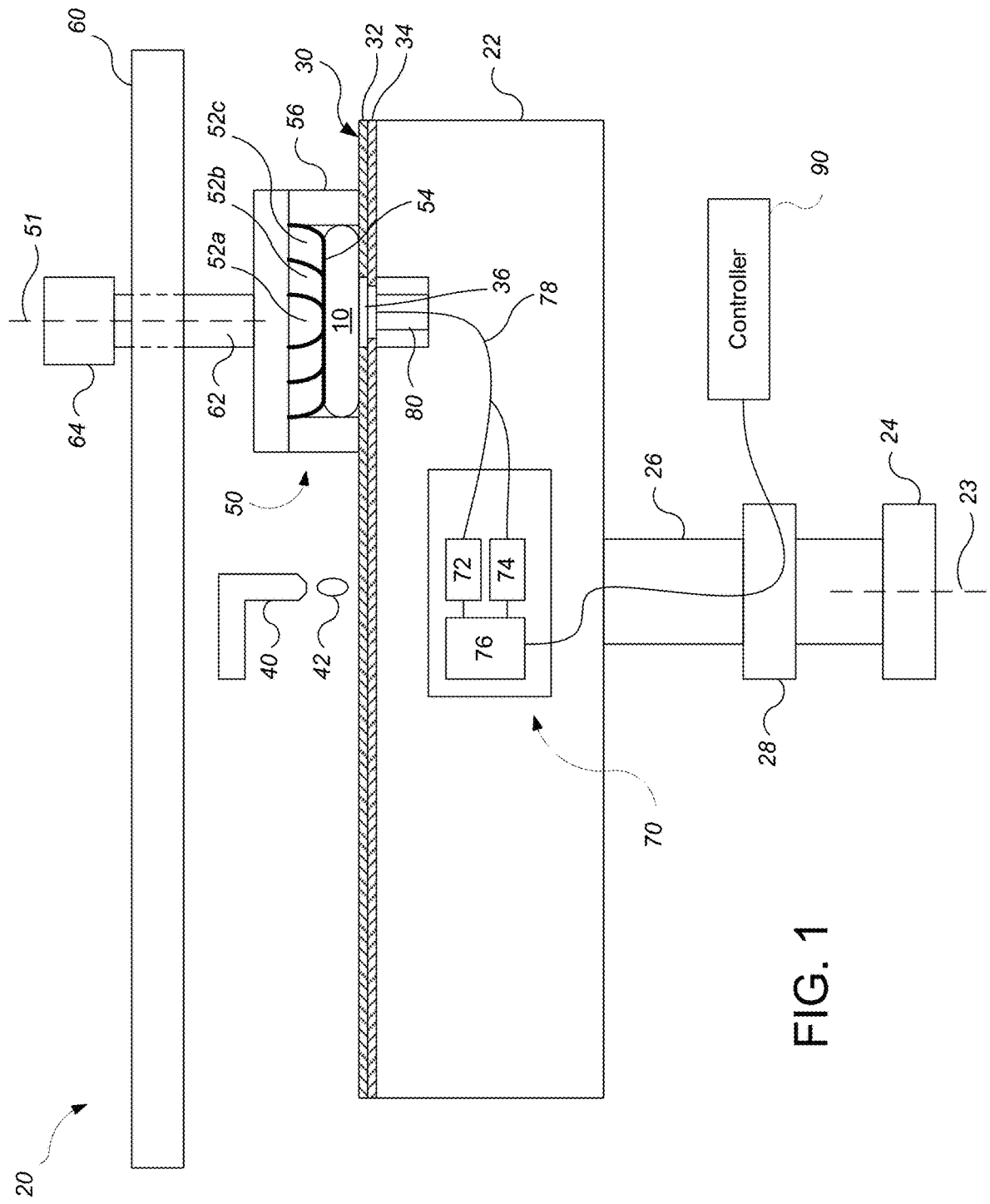
FIG. 1 illustrates a schematic cross-sectional view of an example of a polishing apparatus.

FIG. 1 illustrates an example of a polishing apparatus 20. The polishing apparatus 20 includes a rotatable disk-shaped platen 22 on which a polishing pad 30 is situated. The platen is operable to rotate about an axis 23. For example, a motor 24 can turn a drive shaft 26 to rotate the platen 20. The polishing pad 30 can be detachably secured to the platen 22, for example, by a layer of adhesive. The polishing pad 30 can be a two-layer polishing pad with an outer polishing layer 32 and a softer backing layer 34.

The polishing apparatus 20 can include a polishing liquid supply port 40 to dispense a polishing liquid 42, such as a slurry, onto the polishing pad 30. The polishing apparatus 20 can also include a polishing pad conditioner to abrade the polishing pad 30 to maintain the polishing pad 30 in a consistent abrasive state.

Figure 2:
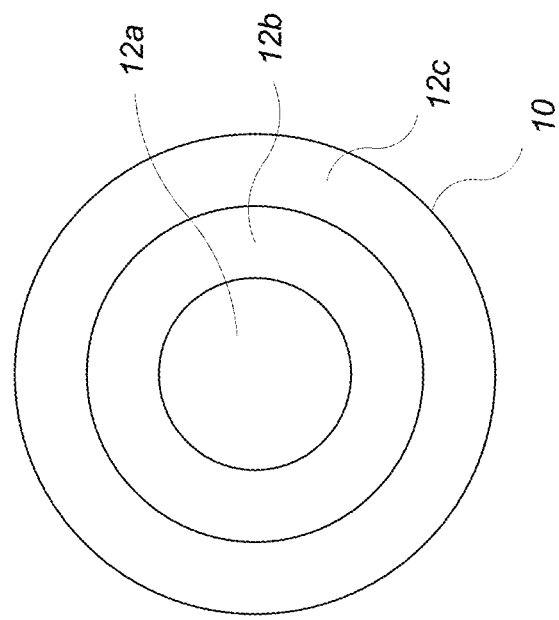
FIG. 2 illustrates a schematic top view of a substrate having multiple zones.

A carrier head 50 is operable to hold a substrate 10 against the polishing pad 30. Each carrier head 50 also includes a plurality of independently controllable pressurizable chambers, e.g., three chambers 52a-52c, which can apply independently controllable pressures to associated zones 12a-12c on the substrate 10 (see FIG. 2). Referring to FIG. 2, the center zone 12a can be substantially circular, and the remaining zones 12b-12c can be concentric annular zones around the center zone 12a.

Returning to FIG. 1, the chambers 52a-52c can be defined by a flexible membrane 54 having a bottom surface to which the substrate 10 is mounted. The carrier head 50 can also include a retaining ring 56 to retain the substrate 10 below the flexible membrane 54. Although only three chambers are illustrated in FIGS. 1 and 2 for ease of illustration, there could be two chambers, or four or more chambers, e.g., five chambers. In addition, other mechanisms to adjust the pressure applied to the substrate, e.g., piezoelectric actuators, could be used in the carrier head 50.

Returning to FIG. 1, each carrier head 50 is suspended from a support structure 60, e.g., a carousel, and is connected by a drive shaft 62 to a carrier head rotation motor 64 so that the carrier head can rotate about an axis 51. Optionally each carrier head 50 can oscillate laterally, e.g., on sliders on the carousel 60; or by rotational oscillation of the carousel itself. In operation, the platen 22 is rotated about its central axis 23, and the carrier head 50 is rotated about its central axis 51 and translated laterally across the top surface of the polishing pad 30.

The polishing apparatus also includes an in-situ monitoring system 70, which can be used to control the polishing parameters, e.g., the applied pressure in one or more of the chambers 52a-52c, to control the polishing rate of one or more of the zones 12a-12c. The in-situ monitoring system 70 generates a signal indicative of the thickness of the layer being polished in each of the zones 12a-12c. The in-situ monitoring system can be an optical monitoring system, e.g., a spectrographic monitoring system, or an eddy current monitoring system.

In one implementation, the monitoring system 70 is an optical monitoring system. The optical monitoring system 70 can include a light source 72, a light detector 74, and circuitry 76 for sending and receiving signals between a remote controller 90, e.g., a computer, and the light source 72 and light detector 74. One or more optical fibers can be used to transmit the light from the light source 72 to a window 36 in the polishing pad 30, and to transmit light reflected from the substrate 10 to the detector 74. For example, a bifurcated optical fiber 78 can be used to transmit the light from the light source 62 to the substrate 10 and back to the detector 74. If the optical monitoring system 70 is a spectrographic system, then the light source 72 can be operable to emit white light and the detector 74 can be a spectrometer.

The output of the circuitry 76 (whether from an optical or eddy current monitoring system) can be a digital electronic signal that passes through a rotary coupler 28, e.g., a slip ring, in the drive shaft 26 to the controller 90. Alternatively, the circuitry 76 could communicate with the controller 90 by a wireless signal. The controller 90 can be a computing device that includes a microprocessor, memory and input/output circuitry, e.g., a programmable computer.

Figure 3:
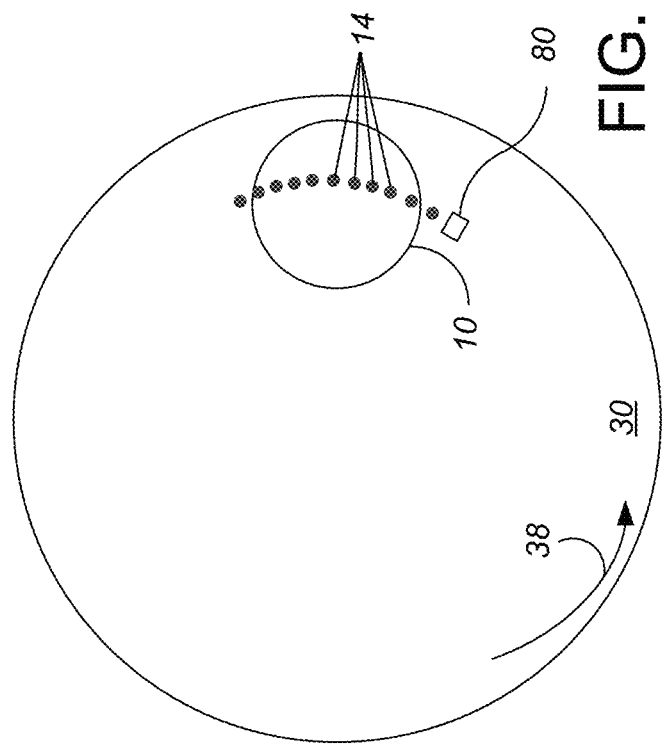
FIG. 3 illustrates a top view of a polishing pad and shows locations where in-situ measurements are taken on a first substrate.

In some implementations, the in-situ monitoring system 70 includes a sensor 80 that is installed in and rotate with the platen 22. For example, the sensor 80 could be the end of the optical fiber for an optical monitoring system or a magnetic core for an eddy current monitoring system. The motion of the platen 22 will cause the sensor to scan across each substrate. As shown by in FIG. 3, due to the rotation of the platen (shown by arrow 38), as the sensor 80 travels below the carrier head, the in-situ monitoring system makes measurements at a sampling frequency; as a result, the measurements are taken at locations 14 in an arc that traverses the substrate 10 (the number of points is illustrative; more or fewer measurements can be taken than illustrated, depending on the sampling frequency).

Over one rotation of the platen, spectra are obtained from different positions on the substrate 10. In particular, some spectra can be obtained from locations closer to the center of the substrate 10 and some can be obtained from locations closer to the edge. The controller 90 can be configured to calculate a radial position (relative to the center of the substrate 10) for each measurement from a scan based on timing, motor encoder information, platen rotation or position sensor data, and/or optical detection of the edge of the substrate and/or retaining ring. The controller can thus associate the various measurements with the various zones 12a-12c (see FIG. 2). In some implementations, the time of measurement of can be used as a substitute for the exact calculation of the radial position.

Returning to FIG. 1, the controller 90 can derive a characterizing value for each zone of the substrate based on the signal from the in-situ monitoring system. The controller 90 can generate at least one characterizing value for each zone for each scan of the sensor below the substrate 10, or generate a characterizing value for each zone at a measurement frequency (which need not be the same as the sampling frequency), e.g., for polishing systems that do not scan the sensor across the substrate. In some implementations, a single characterizing value is generated per scan, e.g., multiple measurements can be combined to generate the characterizing value. In some implementations, each measurement is used to generate a characterizing value.

The characterizing value is typically the thickness of the outer layer, but can be a related characteristic such as thickness removed. In addition, the characterizing value can be a physical property other than thickness, e.g., metal line resistance. In addition, the characterizing value can be a more generic representation of the progress of the substrate through the polishing process, e.g., an index value representing the time or number of platen rotations at which the measurement would be expected to be observed in a polishing process that follows a predetermined progress, or simply a sensor value that varies as the thickness changes.

For eddy current monitoring, the characterizing value could simply be the output of the in-situ monitoring system, e.g., a dimensionless value indicating a % of maximum signal strength. Alternatively, a look-up table could be used to convert the measurement into a thickness value.

For optical monitoring, a variety of techniques are available to convert the optical measurement, e.g., a measured spectrum, into a characterizing value.

One technique to calculate a characterizing value is, for each measured spectrum, to identify a matching reference spectrum from a library of reference spectra. Each reference spectrum in the library can have an associated characterizing value, e.g., a thickness value or an index value indicating the time or number of platen rotations at which the reference spectrum is expected to occur. By determining the associated characterizing value for the matching reference spectrum, a characterizing value can be generated. This technique is described in U.S. Patent Publication No. 2010-0217430.

Another technique is to fit an optical model to the measured spectrum. In particular, a parameter of the optical model is optimized to provide the best fit of the model to the measured spectrum. The parameter value generated for the measured spectrum generates the characterizing value. This technique is described in U.S. Patent Application No. 2013-0237128. Possible input parameters of the optical model can include the thickness, index of refraction and/or extinction coefficient of each of the layers, spacing and/or width of a repeating feature on the substrate.

Calculation of a difference between the output spectrum and the measured spectrum can be a sum of absolute differences between the measured spectrum and the output spectrum across the spectra, or a sum of squared differences between the measured spectrum and the reference spectrum. Other techniques for calculating the difference are possible, e.g., a cross-correlation between the measured spectrum and the output spectrum can be calculated.

Another technique is to analyze a characteristic of a spectral feature from the measured spectrum, e.g., a wavelength or width of a peak or valley in the measured spectrum. The wavelength or width value of the feature from the measured spectrum provides the characterizing value. This technique is described in U.S. Patent Publication No. 2011-0256805.

In each of the above optical techniques, a look-up table could be used to convert the initial value, e.g., index value, parameter value or value of spectral feature, into a thickness value.

In any of these techniques, a sequence of characterizing values is generated for each zone on the substrate. One of the zones can be selected as a reference zone; the remaining zones are controlled zones. The controller 90 provides a feedback control system that is configured to use the sequences of characterizing values from the different zones to adjust the polishing parameter to change the polishing rate in the controlled zones so that all the zones reach their target thickness closer to the same time. Assuming that the target thickness is the same for the different zones, this can improve the WIWNU of the substrate.

Figure 4:
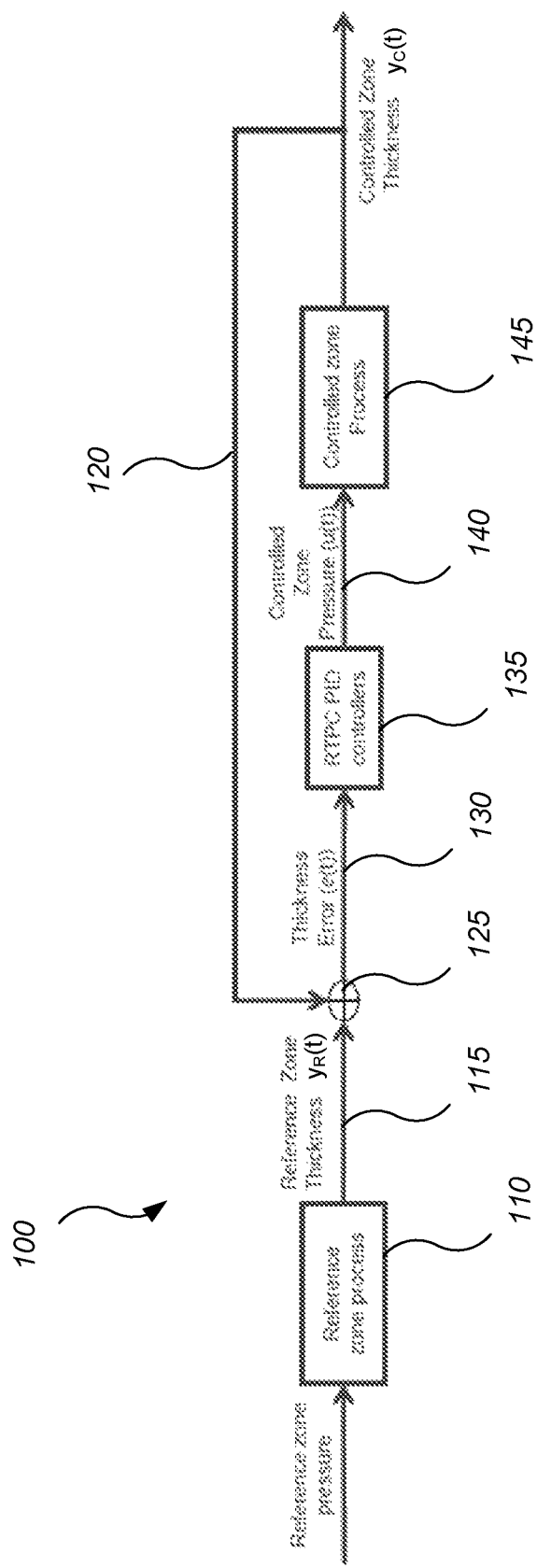
FIG. 4 is a block diagram illustrating an algorithm performed by a prior art proportional-integral-derivative feedback control system.

A conventional proportional-integral-derivative feedback control system 100 is illustrated in FIG. 4. Typically the controller receives a reference zone parameter value (e.g., pressure value) as input from the operator of the polishing system. The processing system applies the process to the substrate using the reference zone parameter value for the reference zone (box 110).

The characterizing value for the reference zone is measured by the in-situ monitoring system, generating a reference zone characterizing value (line 115). This reference zone characterizing value can be one of the values of the sequence of characterizing values for the reference zone. The sequence of characterizing values for the reference zone can be designated $y_R(t)$ with t indicating the time of the measurement. The characterizing value for the control zone is also measured by the in-situ monitoring system, generating a control zone characterizing value (line 120). This control zone characterizing value can be one of the values of the sequence of characterizing values for the control zone. The sequence of characterizing values for the control zone can be designated $y_C(t)$.

The reference zone characterizing value and the control zone characterizing value are compared by a comparator (125), e.g., a difference is measured between the two, to generate an error value (line 130). For example, the control zone characterizing value can be subtracted from the reference zone characterizing value to generate the value. For example, this can be represented for the error value, which can be designated as e(t), by $$e(t) = y_R(t) - y_C(t).$$

This error value can be fed into a PID controller (box 135) to generate an output parameter value, e.g., a carrier head chamber pressure value, for the control zone (see line 140). The PID controller can generate output parameter values on an effectively continuous basis, e.g., at the same frequency as the characterizing values are generated. Alternatively, the output parameter value can be generated less frequently. The sequence of output parameter values can be designated u(t).

For a PID controller, a typical calculation of the parameter value u(t) can be represented by $$u(t) = u(0) + K_P e(t) + K_I \int_0^t e(t)dt + K_D \frac{de(t)}{dt} \qquad \text{(Eq. 1)}$$

where u(0) is a nominal parameter that is fixed and predetermined by the processing recipe (e.g., a predetermined nominal polishing pressure), and $K_P$, $K_I$ and $K_D$ are PID controller parameters.

The processing system applies the process to the control zone of the substrate using the output parameter value (box 145). This causes a variation in the thickness of the substrate in the control zone, which is measured by the in-situ monitoring system, generating the control zone characterizing value (line 120) as noted above.

As noted above, the performance of such a PID feedback control system can be adversely affected by variations in environmental conditions, resulting in drift of the polishing rate and/or thickness profile.

Figure 5:
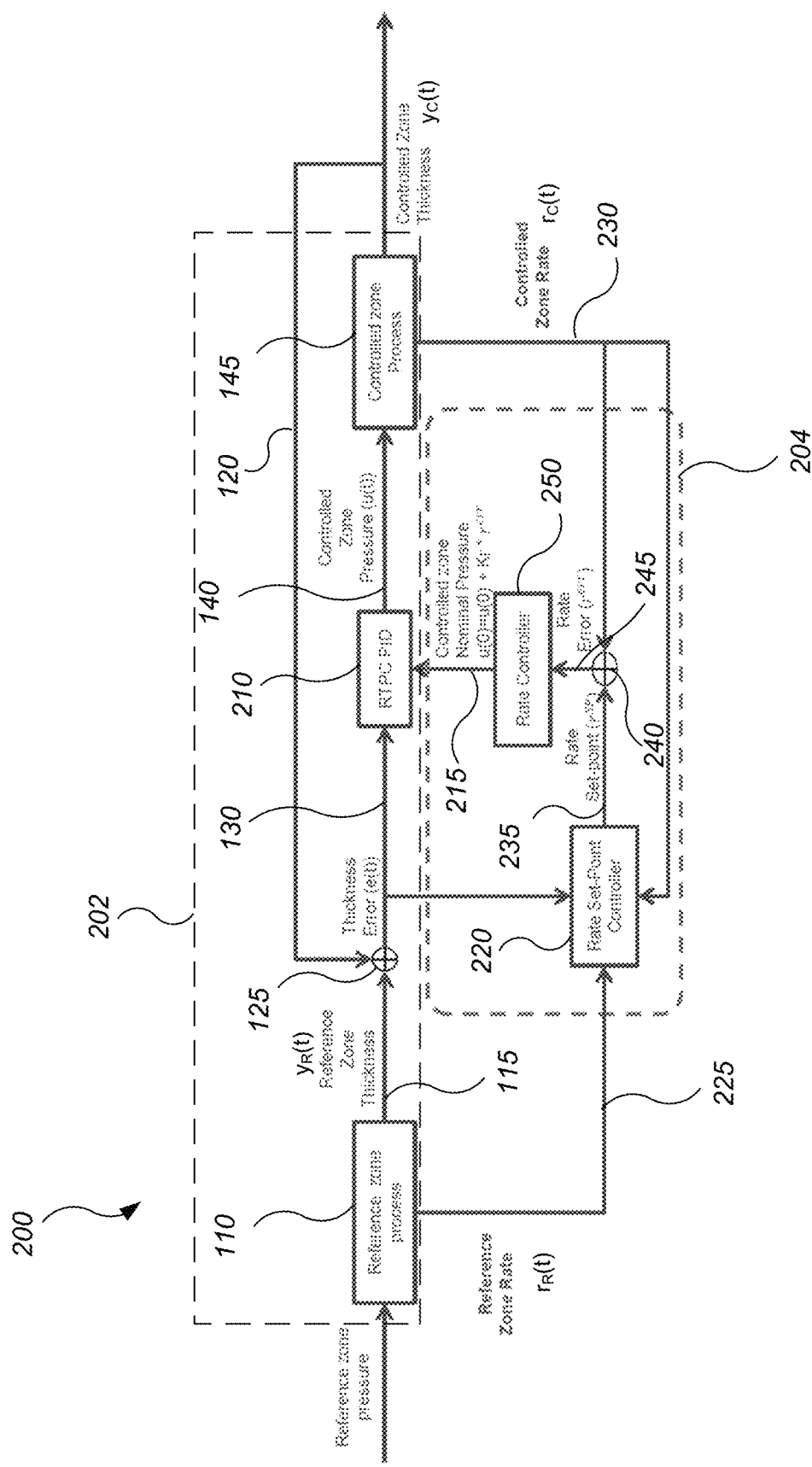
FIG. 5 is a block diagram illustrating an algorithm performed by an implementation of a control system.

Referring to FIG. 5, a control system 200 includes a primary control loop 202 based on characterizing values that is a proportional-integral-derivative feedback control loop, and a secondary control loop 204 based on the rate of change of the characterizing values.

The primary control loop 202 is similar to the control system 100, e.g., unless otherwise specified below. The control system 200 receives a reference zone parameter value and applies the process to the substrate using the reference zone parameter value for the reference zone (box 110). The characterizing value for the reference zone (line 115) and the characterizing value for control zone (line 120) are measured by the in-situ monitoring system, and compared by a comparator (125) to generate an error value (line 130).

The error value is fed into a PID controller (box 210). However, the PID controller also receives a dynamic control zone nominal parameter value (line 215), e.g., a nominal pressure, which can be designated u'(0), from the secondary control loop 204. This dynamic control zone nominal parameter value is updated as polishing progresses.

The dynamic control zone nominal parameter value is used in equation (1) above, replacing the predetermined control zone nominal pressure. That is, the calculation performed by the PID controller can represented by $$u(t) = u'(0) + K_P e(t) + K_I \int_0^t e(t)dt + K_D \frac{de(t)}{dt}$$

The PID controller generates the control zone output parameter value (see line 140), e.g., a carrier head chamber pressure value, for the control zone, which is then used by the processing system.

The secondary control loop 204 includes a rate set point control module (220) that receives the error value (line 130), as well as a reference zone rate (line 225), which can be designated $r_R(t)$, and a control zone rate (line 230), which can be designated $r_C(t)$. The reference zone rate and the control zone rate are rates of change of the characterizing values for the reference zone and the control zone, respectively, e.g., polishing rates.

The reference zone rate (line 225) can be generated by fitting a first function to the sequence of characterizing values for the reference zone and determining the slope of the first function. Similarly, the control zone rate (line 230) can be generated by fitting a second function to the sequence of characterizing values for the control zone and determining the slope of the second function. The first function and/or the second function can be a linear function.

Figure 6:
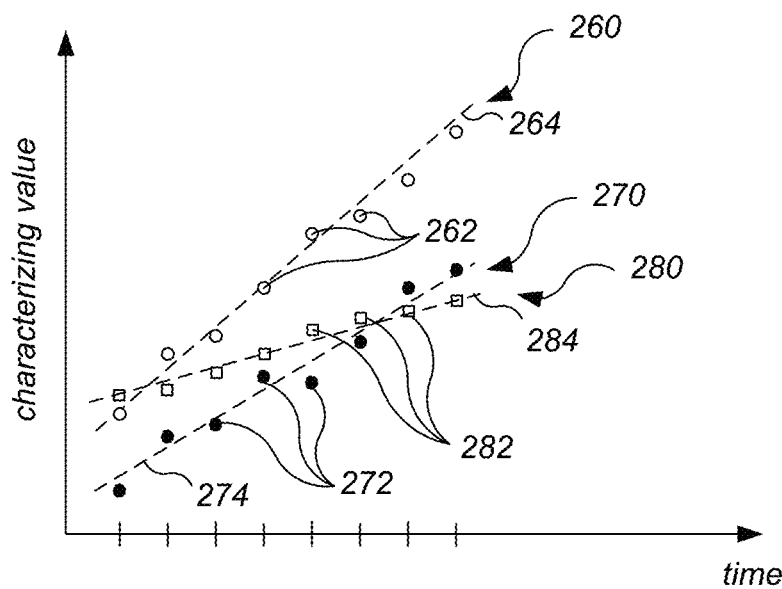
FIG. 6 illustrates a graph of characterizing values as function of time for multiple zones on the substrate.

As noted above, the controller 90 generates a sequence of characterizing values for each zone. For example, referring to FIG. 6, a first sequence 260 of characterizing values 262 (shown by hollow circles) can be generated for a first zone, e.g., zone 12a, which provides the reference. A second sequence 270 of characterizing values 272 (shown by solid circles) can be generated for a second zone, e.g., zone 12b, which provides one of the control zones, and a third sequence 280 of characterizing values 282 (shown by hollow squares) can be generated for a third zone, e.g., zone 12c, which provides another of the control zones.

A first function 264, e.g., a first linear function, is fit to the first sequence 260 of characterizing values 262, and the slope of the first function can be determined to provide the reference zone rate, e.g., $r_R(t)$. Similarly a second function 274, e.g., a second linear function, is fit to the second sequence 270 of characterizing values 272, and the slope of the second function can be determined to provide the control zone rate, e.g., $r_C(t)$.

Returning to FIG. 5, the rate set point control module (220) receives the error value, the reference zone rate and the control zone rate, and outputs a rate set-point value (line 235), which can be designated $r^{SP}$. Several algorithms to determine the rate set-point value will be discussed below.

The reference zone rate and the control zone rate are compared by a comparator (240), e.g., a difference is measured between the two, to generate an error rate (line 245), which can be designated $r^{err}$. For example, the control zone rate can be subtracted from the reference zone rate to generate the error rate. For example, this can be represented for the error rate $r^{err}(t)$ as $$r^{err}(t) = r^{SP}(t) - r_C(t).$$

The error rate can be received by rate control module (250) which outputs the dynamic control zone nominal parameter value based on the error rate. For example, calculation of the dynamic control zone nominal parameter value can be expressed as follows:

$$u'(0) = u(0) + K_R * r^{err}$$

where u(0) is the predetermined control zone nominal parameter value and $K_R$ is a control parameter constant. As noted above, the dynamic control zone nominal parameter value (line 215) is fed into the PID control module (210).

In one implementation, the rate set point value can be calculated according to the following:

$$r^{SP} = r(t) - DSPW * R_{MAX}$$

where $R_{MAX}$ is a predetermined constant that sets a constraint on the rate of change of the control zone, and DSPW is a dynamic set point weight. The dynamic set point weight can be calculated according to the following:

$$DSPW = \frac{1 - e^{-err} * f}{1 + e^{-err} * f}$$

where err is the error value e(t) and f is a tuning value. In some cases, f is a constant. In some case, f can be expressed as $$f = \frac{2}{R_{MAX}} * \frac{d(r^{SP})}{d(err)}$$

(in this case, a differential equation would need to be solved to determine DSPW, F and $r^{SP}$).

Figure 7:
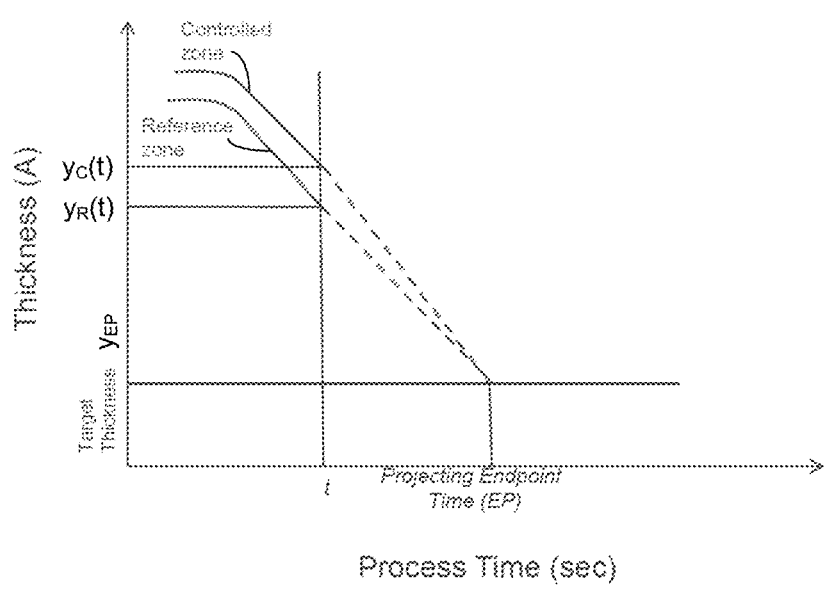
FIG. 7 is a graph illustrating a projection of a polishing rates needed to achieve a target thickness.

Referring to FIG. 7, in another implementation, the rate set point value can be calculated according to the following:

$$r^{SP} = \frac{y_R(t) - y_{EP}}{y_C(t) - y_{EP}} * r_R(t)$$

where $y_R$ and $y_C$ are the characterizing values of the reference zone and control zone, respectively, as discussed above, and $y_{EP}$ is the target characterizing value, e.g., a target thickness.

In some implementations, the error is the accumulated over several prior substrates. In a simple implementation, the total error err used in the calculation for equation 1, err=$k1$*err1+$k2$*err2, where k1 and k2 are constants, err1 is the error calculated from the immediately previous substrate, and err2 are the error calculated for one or more substrates before the previous substrate.

The techniques described above are applicable for optical monitoring of dielectric layers, and for eddy current monitoring of conductive layers.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine-readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing system can be a linear polishing system, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on chemical mechanical polishing, the control system can be adapted to other semiconductor processing techniques, e.g., etching or deposition, e.g., chemical vapor deposition.

Particular embodiments of the invention have been described. Other embodiments are within the scope of the following claims.

What is claimed is:

1. A computer program product, tangibly embodied in a non-transitory computer readable media, comprising instructions for causing a processor to:
    generate, based on a signal from an in-situ monitoring system, a first sequence of characterizing values indicative of a physical property of a reference zone on a substrate undergoing processing in a processing system and being monitored by the in-situ monitoring system;
    generate, based on the signal from the in-situ monitoring system, a second sequence of characterizing values indicative of a physical property of a control zone on the substrate;
    determine a reference zone rate from the first sequence of characterizing values;
    determine a control zone rate from the second sequence of characterizing values;
    determine an error value by comparing a characterizing value for the reference zone to a characterizing value for the control zone;
    calculate, using a proportional-integral-derivative control algorithm, an output parameter value for the control zone in a first control loop based on at least i) the error value and ii) a dynamic nominal control zone value;
    generate the dynamic nominal control zone value in a second control loop based on at least the reference zone rate and the control zone rate; and
    cause the processing system to process the control zone using the output parameter value.

2. The computer program product of claim 1, wherein the instructions to determine the error value comprise instructions to calculate a difference between the characterizing value for the reference zone and the characterizing value for the control zone.

3. The computer program product of claim 1, wherein the instructions to determine the reference zone rate comprise instructions to fit a first function to the sequence of values for the reference zone and to determine a first slope of the first function, and wherein the instructions to determine the control zone rate comprise instructions to fit a second function to the sequence of values for the control zone and to determine a second slope of the second function.

4. The computer program product of claim 1, wherein the instructions to calculate the output parameter value comprise instructions to calculate the parameter value u(t) according to $$u(t) = u'(0) + K_p e(t) + K_I \int_0^t e(t)dt + K_D \frac{de(t)}{dt}$$

where u'(0) is the dynamic nominal control zone value, e(t) is the error value, and $K_P$, $K_I$ and $K_D$ are PID controller parameter constants.

5. The computer program product of claim 1, wherein the instructions to generate the dynamic nominal control zone value comprise instructions to generate an error rate based on at least the reference zone rate and the control zone rate.

6. The computer program product of claim 5, wherein the instructions to generate the error rate comprise instructions to calculate a rate set point value based on the reference zone rate.

7. The computer program product of claim 6, wherein the instructions to calculate the rate set point value comprise instruction to calculate the rate set point value based on the error value, the reference zone rate and the control zone rate.

8. The computer program product of claim 7, wherein the instructions to calculate a rate set point value comprise instructions to calculate the rate set point value $r^{SP}$ according to $$r^{SP} = r_R(t) - DSPW * R_{MAX}$$

where $r_R(t)$ is the reference zone rate, $R_{MAX}$ is a predetermined constant, and DSPW is a dynamic set point weight.

9. The computer program product of claim 8, comprising instruction to calculate the dynamic set point weight according to $$DSPW = \frac{1 - e^{-err} * f}{1 + e^{-err} * f}$$

where err is the error value e(t) and f is a tuning value.

10. The computer program product of claim 6, wherein the instructions to calculate the rate set point value comprise instruction to calculate the rate set point value based on the characterizing value for the reference zone, the characterizing value for the control zone, and the reference zone rate, and a target characterizing value.

11. The computer program product of claim 10, wherein the instructions to calculate the rate set point value comprises instructions to calculate the rate set point value $r^{SP}$ according to the following:

$$r^{SP} = \frac{y_R - y_{EP}}{y_c - y_{EP}} * r_R(t)$$

where $y_R$ and $y_C$ are the characterizing values of the reference zone and control zone, respectively, $y_{EP}$ is the target characterizing value, and $r_R(t)$ is the reference zone rate.

12. The computer program product of claim 6, wherein the instructions to generate the error rate comprise instructions to compare the rate set point value to the control zone rate.

13. The computer program product of claim 12, wherein the instructions to generate the error rate comprise instructions to calculate a difference between the rate set point value and the control zone rate.

14. The computer program product of claim 5, wherein the instructions to generate the dynamic nominal control zone value comprise instructions to calculate the dynamic nominal control zone value from the error rate and a predetermined control zone nominal pressure.

15. The computer program product of claim 5, wherein the instructions to generate the dynamic nominal control zone value comprise instructions to calculate the dynamic nominal control zone value u'(0) according to $$u'(0) = u(0) + K_R * r^{err}$$

where u(0) is a predetermined control zone nominal pressure, $K_R$ is a control parameter constant and $r^{err}$ is the error rate.

16. A method of controlling processing of a substrate, comprising:
    generating, based on a signal from an in-situ monitoring system, a first sequence of characterizing values indicative of a physical property of a reference zone on a substrate undergoing processing and being monitored by the in-situ monitoring system;
    generating, based on the signal from the in-situ monitoring system, a second sequence of characterizing values indicative of a physical property of a control zone on the substrate;
    determining a reference zone rate from the first sequence of characterizing values;
    determining a control zone rate from the second sequence of characterizing values;
    determining an error value by comparing a characterizing value for the reference zone to a characterizing value for the control zone;
    calculating, using a proportional-integral-derivative control algorithm, an output parameter value for the control zone in a first control loop based on at least i) the error value and ii) a dynamic nominal control zone value;
    generating the dynamic nominal control zone value in a second control loop based on at least the reference zone rate and the control zone rate; and
    processing the substrate, including processing the control zone of the substrate according to the output parameter value.

17. The method of claim 16, comprising processing the reference zone of the substrate according to a reference zone parameter value.

18. The method of claim 16, wherein processing the substrate comprises polishing the substrate.

19. The method of claim 16, wherein the in-situ monitoring system comprises an optical monitoring system and/or an eddy current monitoring system.

20. A polishing system, comprising:
    a platen to hold a polishing pad;
    a carrier to hold a substrate in contact with the polishing pad;
    a motor coupled to at least one of the platen and the carrier to create relative motion therebetween;
    an in-situ monitoring system configured to generate a signal indicative of a physical property of the substrate during polishing of the substrate; and
    a controller to receive the signal and configured to generate, based on the signal from the in-situ monitoring system, a first sequence of characterizing values indicative of the physical property of a reference zone on the substrate;

generate, based on the signal from the in-situ monitoring system, a second sequence of characterizing values indicative of the physical property of a control zone on the substrate;

determine a reference zone rate from the first sequence of characterizing values;

determine a control zone rate from the second sequence of characterizing values;

determine an error value by comparing a characterizing value for the reference zone to a characterizing value for the control zone;

calculate, using a proportional-integral-derivative control algorithm, an output pressure value for the control zone in a first control loop based on at least i) the error value and ii) a dynamic nominal control zone value;

generate the dynamic nominal control zone value in a second control loop based on at least the reference zone rate and the control zone rate; and cause the carrier to apply the output pressure value to the control zone of the substrate.

* * * * *